United States Patent
Lasser et al.

(10) Patent No.: US 8,112,682 B2
(45) Date of Patent: Feb. 7, 2012

(54) METHOD AND DEVICE FOR BAD-BLOCK TESTING

(75) Inventors: Menahem Lasser, Kochav Yair (IL); Mark Shlick, Ganei Tikva (IL)

(73) Assignee: SanDisk IL Ltd, Kfar Saba (IL)

( * ) Notice: Subject to any disclaimer, the term of this patent is extended or adjusted under 35 U.S.C. 154(b) by 252 days.

(21) Appl. No.: 12/428,485

(22) Filed: Apr. 23, 2009

(65) Prior Publication Data
US 2010/0275073 A1 Oct. 28, 2010

(51) Int. Cl.
*G11C 29/00* (2006.01)
(52) U.S. Cl. .......................... 714/718; 714/733
(58) Field of Classification Search .............. 711/54, 711/103, 162, 170; 714/2, 718, 742, 733
See application file for complete search history.

(56) References Cited

U.S. PATENT DOCUMENTS

| 7,171,536 | B2 * | 1/2007 | Chang et al. ............... 711/170 |
| 7,424,659 | B2 * | 9/2008 | Avraham .................. 714/742 |
| 7,676,640 | B2 * | 3/2010 | Chow et al. ................ 711/162 |
| 7,702,984 | B1 * | 4/2010 | Lee et al. .................. 714/742 |
| 7,788,553 | B2 * | 8/2010 | Chow et al. ................ 714/718 |
| 2006/0282626 | A1 * | 12/2006 | Fin ........................... 711/154 |
| 2007/0136509 | A1 * | 6/2007 | Agami ...................... 711/103 |
| 2007/0168840 | A1 | 7/2007 | Roohparvar |
| 2010/0023800 | A1 * | 1/2010 | Harari et al. ................. 714/2 |

* cited by examiner

*Primary Examiner* — David Ton
(74) *Attorney, Agent, or Firm* — Martine Penilla Group, LLP

(57) ABSTRACT

Apparatus and methods for effecting bad-block testing operations are disclosed herein. In some embodiments, instead of effecting bad-block testing for the majority of the flash memory blocks of a flash memory device during manufacture, most or all bad-block testing is postponed until the end user is in possession of the flash memory device. In some embodiments, after user data is received by the flash memory device from a host device, one or more blocks of the flash memory device are subjected to bad-block testing.

23 Claims, 12 Drawing Sheets

CONFIDENTIAL SANDISK ATTORNEY-CLIENT
PRIVILEGED COMMUNICATION

PRIOR ART

CONFIDENTIAL SANDISK ATTORNEY-CLIENT
PRIVILEGED COMMUNICATION

PRIOR ART

| Block ID | Participation Status Code |
|---|---|
| 235 | 1 |
| 236 | 0 |
| 237 | 1 |
| 238 | 1 |
| 239 | 1 |

Participation Table
286

| Block ID | Test Results Code |
|---|---|
| 235 | 1 |
| 236 | X |
| 237 | 1 |
| 238 | 0 |
| 239 | 1 |

Testing Results Table
288

Bad-block-testing Participation-status
Data structure 284

FIG. 6A

| Block ID | Status Code |
|---|---|
| 235 | 2 |
| 236 | 0 |
| 237 | 2 |
| 238 | 1 |
| 239 | 2 |

0 = untested
1 = fail
2 = pass

Hybrid Table/Array

Bad-block-testing Participation-status
Data structure 284

METHOD AND DEVICE FOR BAD-BLOCK TESTING

FIELD OF THE INVENTION

The present invention relates to methods and devices for bad-block testing of a flash memory.

BACKGROUND OF THE INVENTION

Flash Memory Devices

Non-volatile memory is a type of memory that can retain its stored data without a power source. There are several types of non-volatile memories, with different read, write and erase capabilities, access times, data retention, data endurance cycles, etc. Electrically Erasable Programmable Read Only Memory (EEPROM) is capable of performing read write operations on a per-byte level, which means that each of the memory locations can be individually read and written.

Flash memory, comprised of flash-type floating-gate transistors, or cells, is a non-volatile memory similar in functionality and performance to EEPROM memory; flash memory has the advantage of being relatively inexpensive, although it operates under certain limitations. It is not possible to rewrite to a previously written location on flash memory without first erasing an entire memory section, i.e., the flash cells must be erased (e.g. programmed to "one") before they can be programmed again. Flash memory can only erase relatively large groups of cells, usually called erase blocks (for example, 16 KB to 2 MB in size for many current commercial devices—it is anticipated that the size of erase blocks will increase in the future, as devices with higher capacity become commercially available).

Testing of Flash Memory Devices

Flash memory dies require extensive testing before being put to use in a product. This is especially true for NAND flash. One reason for this is that the flash device might have bad blocks that should not be used. A block is the smallest chunk of cells that can be erased in a single erase operation, and it typically contains many pages, where a page is the smallest chunk of cells that can be written in a single write operation. If a block cannot be reliably erased to the all "1" state or if one or more pages of the block cannot be reliably programmed, then the block should be either replaced by another block by physically trimming the die or be marked as a bad block so that software writing to the device will be able to avoid using it.

A given flash memory die may be subjected to other tests, but the testing for bad blocks is typically the most time consuming. This is because testing for bad blocks typically involves writing to each and every page and erasing each and every block of the device. The writing and erasing is typically repeated more than once in order to make the bad blocks testing under different patterns of written data, under different temperatures, or under other variations of testing parameters.

There is an ongoing need for methods which facilitate testing of flash memory devices in a cost effective manner.

Systems Including a Flash Memory Device Coupled to a Host Device

One type of flash memory device is a "peripheral flash storage device" which is now discussed with reference to FIG. 1.

"Peripheral flash storage devices" 260 are well-known in the art of computing, in form factors such as USB flash drives (UFD); PC-cards; and small storage cards used with digital cameras, music players, handheld and palmtop computers, cellular telephones or any other form factor.

When coupled to a host device 310 (for example, a laptop or desktop computer or a mobile telephone), the peripheral flash storage devices 260 may receive user data via respective host side 350 and device side 250 interfaces (for example, a USB interface or an SD interface or an MMC interface or any other kind of interface). The received data may be written by flash controller 280 to flash memory 270 of the flash memory storage device.

A Discussion of a Prior Art Routine for Testing and Using Flash Memory Devices

FIG. 2 is a flow chart of a prior art routine for testing and using flash memory devices. In FIG. 2, steps S105-S115 are carried out in a manufacturing facility, and step S127 is carried out in the "field" when the device has already left the manufacturing facility and is 'in-use' for example, by an 'end' user.

In step S105, the flash memory device is assembled. With reference to FIG. 3, it is noted that assembling of step S105 may include inserting a flash controller die 102 and a flash memory die 100 into a housing 112 of the flash memory device and/or fastening the controller die 102 and memory die 100 to the housing 112. In step S105 the flash device 260 is configured so that the flash controller 280 residing on the flash controller die 102 is operative to write data received via device-side interface 250 to flash memory 270 residing on flash memory die 100.

In order to deliver a device of acceptable quality to an end-user, the flash memory residing on flash memory die 100 is subjected to one or more tests, including, bad-block testing. Thus, in step S111, each flash memory device 260 is coupled to a memory tester 106, and in step S115, each coupled flash memory device 260 is subjected to 'bad-block testing'—for example, a testing procedure whereby known test data patterns of data are written to each flash block, and then read back.

Memory tester 106 can typically test a large number of flash devices 260 simultaneously for example, at least 100 flash devices.

Typically, in order for any flash block to be considered 'usable' by an end user, it is necessary to subject the flash block to bad block testing before attempting to write user data to the flash block. Therefore step S115 is carried out such that substantially all flash blocks (in modern flash devices, this is usually at least 1,000 flash blocks) of flash memory 270 are subjected to bad block testing.

In step S123, each flash device 260 is coupled to a respective host device 310. In one use case, each device is individually shrink-wrapped and shipped to distribution points (for example, retail outlets or shipping centers). In this use case, the users can purchase the shrink-wrapped flash devices, open the packing, and couple the device to a host device 'in the field.'

In another use case, the flash device may be deployed within a housing of a host device—for example, within a laptop computer housing, a cell phone housing or any other housing.

In step S127, the flash device 260 (i.e. which has been previously subjected to bad-block testing) receives user data from the host for storage in flash memory 270.

One important feature of the prior art is that after the user data has been received from the host no bad block testing of flash memory 270 is carried out.

SUMMARY OF EMBODIMENTS

It is now disclosed for the first time a method of operating a flash device having a flash memory, the method comprising:

a) receiving user data by the flash device from a host device coupled to the flash device; and b) after the receiving, effecting a bad-block testing operation for at least one flash block of the flash memory device.

In some embodiments, the bad-block testing operation is carried out in response to the user data receiving.

In some embodiments, the effecting of the bad-block testing operation includes: i) determining one or more target blocks to which the user data is to be written; and ii) in response to the determining, subjecting the determined one or more target flash blocks to bad-block testing.

In some embodiments, the method further comprises: c) in response to the bad-block testing of the one or more target flash blocks, updating a bad-block-testing participation-status data structure that describes which blocks of the flash memory have gone through a bad block test, the updating being carried out to indicate that the one or more target flash blocks have gone through bad-block testing.

In some embodiments, the updating is carried out in a manner that is not contingent upon the results of the bad-block testing of the one or more target blocks. In some embodiments, the updating is further carried out to indicate, within the bad-block-testing participation-status data structure, the results of the bad-block testing of the one or more target flash blocks.

In some embodiments, the bad-block-testing participation-status data structure resides in the flash memory device.

In some embodiments, the bad-block-testing participation-status data structure resides in a controller of the flash memory device.

In some embodiments, the method further comprises: c) in response to completing the bad-block testing operation for the at least one flash block of the flash memory device, storing the user data in the at least one bad-block-tested flash blocks.

In some embodiments, the bad-block testing is carried out in a background process.

It is now disclosed for the first time a flash device comprising: a) a device interface for coupling with a host device; b) a flash memory including a plurality of flash blocks; and c) a flash controller operative to: i) receive user data by the flash device from the host device; and ii) after the receiving, effect a had-block testing operation for at least one of the flash blocks.

It is now disclosed for the first time a method of manufacturing a flash device, the method comprising: a) embedding code into the flash device which configures the flash device to effect at least one bad block test operation after receiving user data.

In some embodiments, the method further comprises: b) testing the flash device. In some embodiments, the method further: c) packing and shipping the flash device, wherein: i) the testing is carried out before the packing and the shipping; and ii) the testing includes effecting only a lightweight testing to a majority of flash blocks of the flash device.

In some embodiments, the method further comprises: c) packing and shipping the flash device, wherein: i) the testing is carried out before the packing and the shipping; and ii) the testing includes effecting a bad block testing to only a small minority of flash blocks of the flash device.

In some embodiments, the method further comprises: b) before the code embedding, testing at least a portion of flash memory of the flash device.

In some embodiments, the testing includes effecting only a lightweight testing to a majority of flash blocks of the flash device.

In some embodiments, the testing includes effecting a bad block testing to only a small minority of flash blocks of the flash device.

It is now disclosed for the first time a computer program product, comprising a computer usable medium having a computer readable program code embodied therein, said computer readable program code adapted to be executed to implement a method of operating a flash device, the method comprising: a) receiving user data by the flash device from a host device coupled to the flash device; and b) after the receiving, effecting a bad-block testing operation for at least one flash block of the flash memory device.

It is now disclosed for the first time a method of writing data to a flash device having a flash memory, the method comprising: a) receiving data into the flash device from a host device coupled to the flash device; b) reading at least a portion of a bad-block-testing participation-status data structure describing which blocks of the flash memory have gone through a bad block test; and c) only writing the received data to a particular flash block if, according to results of the reading, the particular flash block has gone through the bad block test In some embodiments, i) the bad-block-testing participation-status data structure also indicates, for one or more of the blocks of the flash memory which have gone through a bad block test, bad block test results; and ii) the writing of the received data to the particular flash block is contingent upon a positive result for the particular block being stored in the bad-block-testing participation-status data structure.

In some embodiments, the reading of step (b) is carried out in response to the data receiving of step (a).

In some embodiments, the bad-block-testing participation-status data structure resides in the flash memory device.

In some embodiments, the bad-block participation-status data structure resides in a controller of the flash memory device.

It is now disclosed for the first time a flash device comprising: a) a device interface for coupling with a host device; b) a flash memory including a plurality of flash blocks; and c) a flash controller operative to: i) receive data into the flash device from a host device coupled to the flash device; ii) read at least a portion of a bad-block-testing participation-status data structure describing which blocks of the flash memory have gone through a bad block test; and iii) only writing the received data to a particular flash block if, according to results of the reading, the particular flash block has gone through the bad block test.

It is now disclosed for the first time a computer program product, comprising a computer usable medium having a computer readable program code embodied therein, said computer readable program code adapted to be executed to implement a method of writing data to a flash device having a flash memory, the method comprising: a) receiving data into the flash device from a host device coupled to the flash device; b) reading at least a portion of a bad-block-testing participation-status data structure describing which blocks of the flash memory have gone through a bad block test; and c) only writing the received data to a particular flash block if, according to results of the reading, the particular flash block has gone through the bad block test.

It is noted that features described above as pertaining to certain embodiments may also be included in other embodiments, unless indicated to the contrary herein below.

BRIEF DESCRIPTION OF THE DRAWINGS

FIGS. 6A, 6B are diagrams of exemplary bad-block-testing participation-status data structures.

DETAILED DESCRIPTION OF EMBODIMENTS

The claims below will be better understood by referring to the present detailed description of example embodiments with reference to the figures. The description, embodiments and figures are not to be taken as limiting the scope of the claims. It should be understood that not every feature of the presently disclosed methods and apparatuses for bad blocks testing is necessary in every implementation. It should also be understood that throughout this disclosure, where a process or method is shown or described, the steps of the method may be performed in any order or simultaneously, unless it is clear from the context that one step depends on another being performed first. As used throughout this application, the word "may" is used in a permissive sense (i.e., meaning "having the potential to"), rather than the mandatory sense (i.e. meaning "must").

Figure 2:
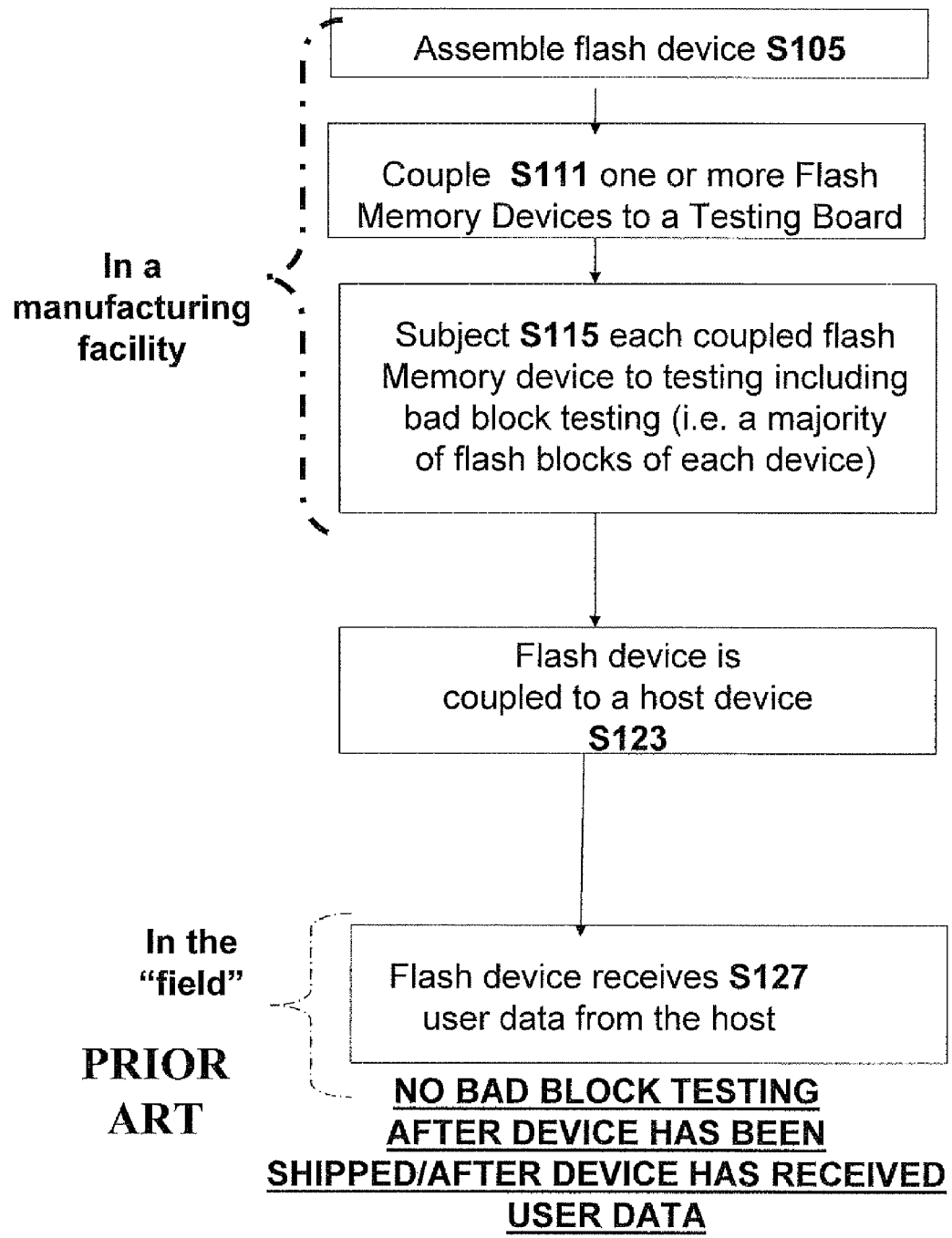
FIG. 2 is a block diagram of a flash memory-based peripheral storage device coupled to a host device in accordance with the prior art.
Figure 3:
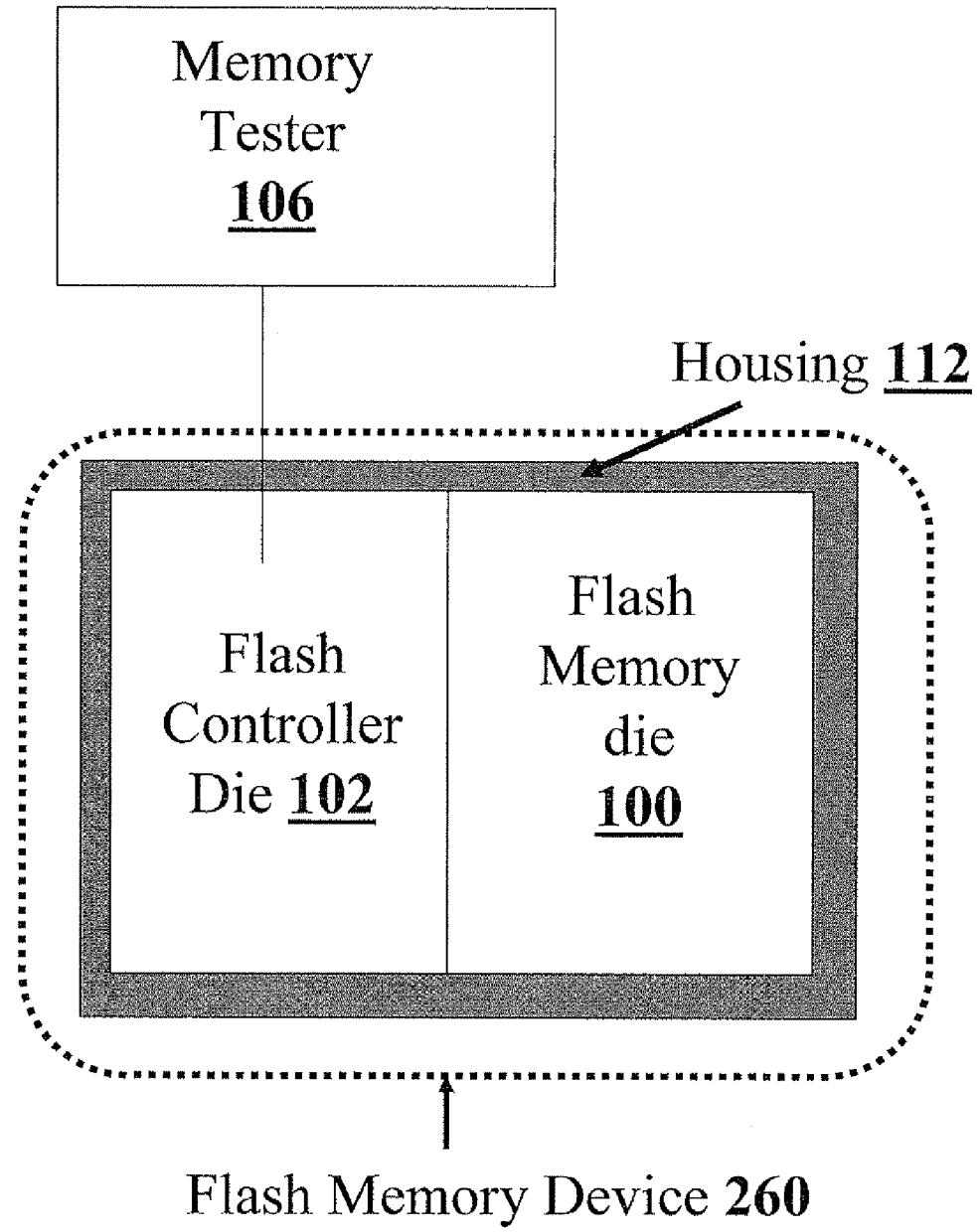
FIG. 3 is a block diagram of a system for testing flash memory in accordance with the prior art.

Embodiments of the present invention relate to a manufacturing technique whereby testing for bad blocks (in the prior art, carried out in step S115 of FIG. 2) is postponed until the user activates the memory product (for example the memory card inside his camera) in the field. By postponing bad block testing to a later time (i.e. after the flash device has been distributed to an end user), it possible to streamline the manufacturing process, thus reducing the costs associated with the flash die production.

Thus, in some embodiments, at a time that the flash memory device is 'shipped' to the end user, a majority (or a substantial majority of at least 80% or at least 95% or at least 99%) of flash memory blocks of the flash device have not yet subjected to bad block testing.

In order to minimize the risk that the end user will receive 'poor service' from an unreliable flash memory device that has not been 'properly tested,' in some embodiments, it is possible to take one or more actions during manufacturing and/or in the field.

In one example, during manufacturing, before the flash device has been shipped, most or all blocks are subjected to some sort of short or 'light weight' test which is much less time consuming than bad block testing—for example, by verifying the operation of the 'common circuitry and logic' common to reading and writing of all blocks, without verifying block-specific electronic elements specific to each flash block (or at least without verifying the block-specific electronic elements for more than a 'small sample' of flash blocks that is no more than 20% of all flash blocks). Typically, this light-weight testing is much faster than the bad block testing of a majority of flash blocks described with reference to FIG. 2. Thus, this light-weight testing does not significantly impact the amount of time required to 'manufacture' the flash device (i.e., prepare the flash device for shipping to an end user), in contrast to the bad block testing of a majority of flash blocks.

Furthermore, in the 'field,' in order to minimize this risk of the user noticing that a flash device is 'unreliable,' the flash controller 280 may (i) 'be aware' of the fact that most of the blocks are still not verified to be good blocks, and (ii) manage the flash device 260 accordingly. Thus, in some embodiments, the flash controller 280 ensures that no block is used for storing user data unless an 'in-the-field' bad-block test is first run (for example by flash controller 280) to verify the block's condition. For each given flash memory block, if the bad block test shows that the given flash block is good, the given block may be used for storing user data. Otherwise, the given block is marked as bad and another block is used for storing user data instead.

Thus, even though the flash device is shipped in a state where most or all of the blocks have not been bad-block tested, it is still possible to enforce a policy whereby no block is used for storing user data before it has been verified to be a good block.

In one example, the 'in-the-field' bad block testing may be carried out 'on-demand'—i.e. in response to a directive to write user data to a particular flash block. In many use cases, the amount of time required to carry out the 'on-demand' bad block testing is only a few tenths of a second in the execution of the planned write operation—the exact time may depend on the size of the block, speed of writing and/or reading flash pages, or any other relevant factor. Thus, in some embodiments, the bad block testing will only delay completion of the write operation by a few tenths of a second.

For each block of the flash device, the bad block testing only needs to be carried out once until the block is designated a 'good block.' Therefore, in some embodiments, this 'performance hit' due to the need for bad block testing may only occur a single time for each given flash block—i.e. the first time it is needed to write data to the given flash block.

As noted above, in some embodiments, the 'in-field' bad block testing of the target block may be carried out 'on demand'—i.e. in response to a request received from the host to store user data to flash memory (for example, to a particular target block), the target block is tested. In many portable memory devices (for example, portable USB drives) the host addresses the storage space using logical addresses which are then translated to memory physical addresses by the controller of the memory device. In such cases where the host provides 'addressing information,' the determination of which physical block is to be bad-block-tested (if not already tested) may be carried out by the controller rather than by the host, as the controller determines the target physical block in which the data is to be stored. However, for the purpose of the present disclosure, the case where the host provides addressing information is also considered to be a specific example of 'on-demand' bad block testing carried out in response to a request received from the host to store user data to a particular target block.

Alternatively or additionally, it may be possible to reduce the amount of 'performance delay' detectable by the host device (i.e. when the host device sends user data to the flash device to be written to flash memory and waits for some indication that this operation has been completed and that the user data is 'safely stored' to flash memory) by carrying out 'in the field bad block testing' in the 'background,' during 'idle time.' For example, this in-the-field bad block testing may be carried out when the flash memory device is not handling read or write requests from the host device, or when the flash memory has 'extra resources' available for bad block testing. The bad block test may be carried out (for example, by executing firmware) in any manner—according to their physical address order, according to random order, or in any other manner.

In some embodiments, the background testing will not completely eliminate the need for 'on-demand' testing—for example, if there is a directive to write data to a flash block that has not yet been subjected to bad block testing, then this block will need to be tested on-demand.

In some embodiments, a data structure (which may be managed, for example, by executing firmware executed by the flash controller) describing which flash blocks have been tested and which flash blocks have not been tested is maintained This 'bad-block-testing participation-status data structure' data structure may be stored in volatile and/or non-volatile memory, and may be useful for planning 'in-background' bad block testing and/or for avoiding potentially time-consuming multiple bad block testings of a single flash block or for any other purpose.

In one non-limiting example, an array of one-bit flags, one flag per block is stored. According to this example, if the corresponding flag of a block is set—the block is not verified yet and the test should be run. If the corresponding flag is clear—this indicates that the block was already tested and that there is no need to test it again. In addition there may be a flag per each block indicating whether each block is bad—this flag is set if the test of the block finds it to be bad. In some embodiments related to this example, when the memory leaves the manufacturing site, the arrays of flags are initialized to indicate, for each block (except those blocks included in the tested 'sample' if such a sample exists), a nontested-yet condition. This guarantees the above logic provides the desired behavior. It is noted that the aforementioned array of one bit flags is one example of a 'bad-block-testing-status data structure' which may be utilized when carrying out the 'on-demand' testing technique and/or when carrying out the 'background' testing.

Thus, it is possible to minimize the performance cost of 'in-field' bad block testing while minimizing or eliminating the risk of using a bad block to store user data.

Definitions

For convenience, in the context of the description herein, various terms are presented here. To the extent that definitions are provided, explicitly or implicitly, here or elsewhere in this application, such definitions are understood to be consistent with the usage of the defined terms by those of skill in the pertinent art(s). Furthermore, such definitions are to be construed in the broadest possible sense consistent with such usage.

For the present disclosure, the term "user data" refers to 'meaningful' data provided by host device 310 to flash storage device 260 that is not known to the manufacturer of the flash storage device at the time of manufacturing "User data" thus excludes test data patterns that are put into the memory device by the decision of its manufacturer. That the data is "meaningful" excludes from the scope of "user data" random or pseudo-random data that has no meaning except for testing purposes.

The term "bad block test" should be understood herein to mean any testing procedure by which a specific flash memory block is "finally" determined to be "bad" or "good." By definition, 'bad block testing' is considered to be 'heavyweight testing' and is a test whereby a final decision is made by the flash device if the block is "bad" or "good" Determining that a specific block is 'bad' (i.e. in the aforementioned 'final decision') implies avoiding using it (even if other blocks on the same flash die are good blocks) and determining that a block is good (i.e. in the aforementioned 'final decision') implies making the block available for use in case of need. The testing procedure typically includes writing data into the tested block and reading data from the tested block, but this is not limiting and any block-specific procedure making the "bad versus good determination" is a "bad block test" for the purpose of the present disclosure.

The term 'bad-block-testing participation-status data structure' refers to any data structure (for example, a table(s) or any other data structure) that indicates which flash blocks have gone through a bad-block test—i.e. which flash blocks have been subjected to bad-block testing and designated either as 'good' blocks or as 'bad' blocks. A flash block which has 'gone through a bad-block' test is a block which has been subjected to bad-block testing.

Figure 4:
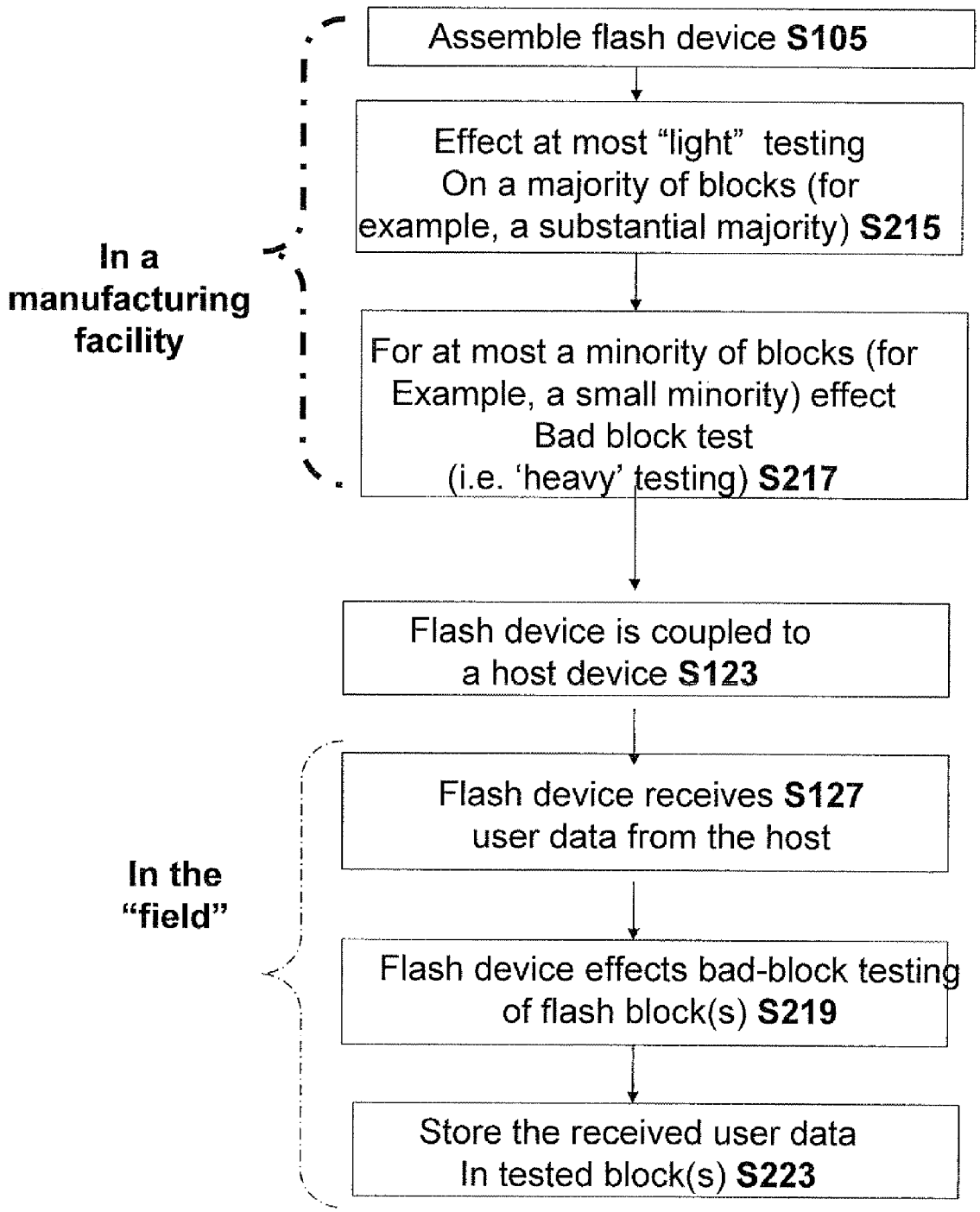
FIGS. 4 and 7 are flow charts of routines for testing and using flash memory devices in accordance with some embodiments.

A Discussion of FIG. 4

Figure 1:
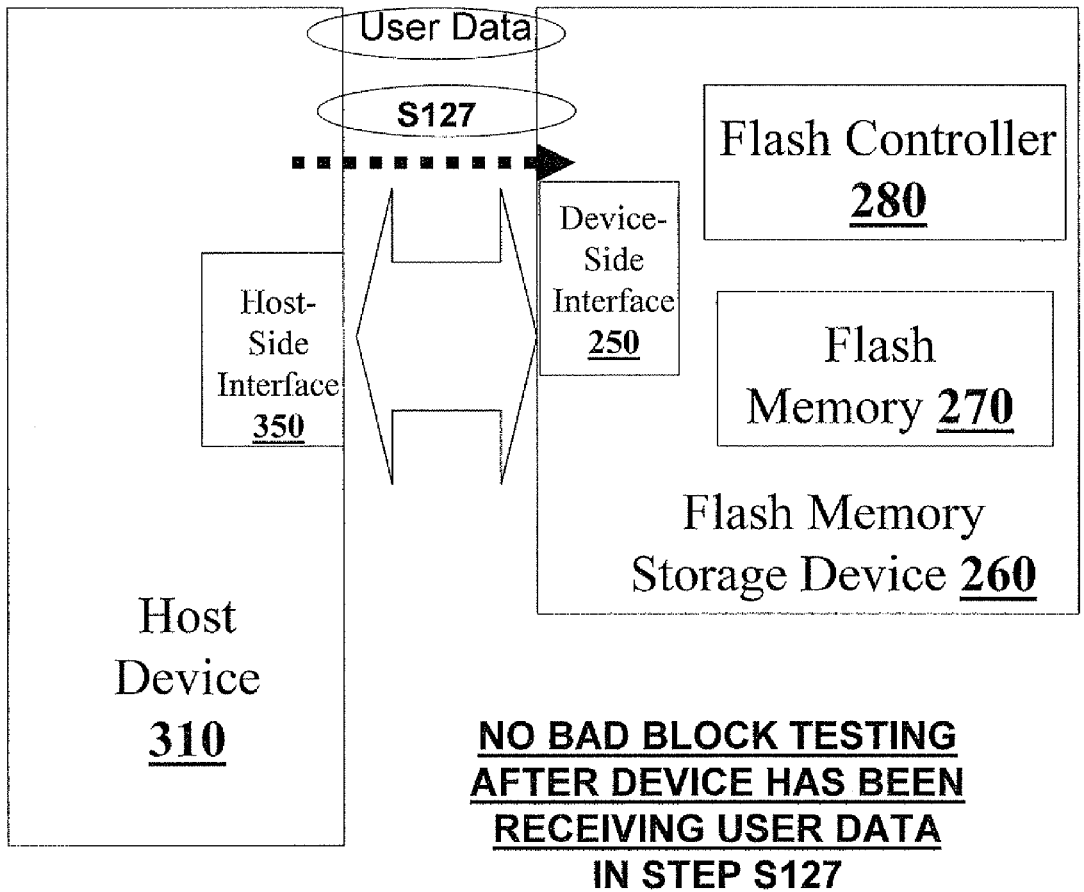
FIG. 1 is a block diagram of a system including a flash memory storage device and a host device in accordance with the prior art.

FIG. 4 is a flow chart of a routine for testing and using a flash memory device in accordance with some embodiments. In step S105, the flash memory devices are each assembled, for example, as described earlier with reference to FIG. 2. In contrast to the prior art routine of FIG. 1, in the manufacturing facility, the flash devices are not subjected to 'intense' bad block testing, whereby at least a majority of blocks of flash memory 270 are bad blocked tested according to the aforementioned definition of "bad-block testing" (i.e. where a final decision is made). In the routine of FIG. 4, either (i) testing of the flash memory is skipped altogether during manufacturing (and in the manufacturing facility) (i.e. to skip steps S215 and S217 of FIG. 4) or (ii) one or both of steps S215 and S217 are carried out.

In step S215, at most "lightweight" testing is effected to at least some of flash blocks—for example, a majority of blocks or even a substantial majority (for example, at least 70% or at least 90% of blocks) of blocks. In this "lightweight" testing no final decision is made about whether a given block that is "lightweight" tested is a "known good block" (i.e. to be made available for storing user data) or a "known bad block (i.e. to be forbidden for storing user data). In some embodiments, this lightweight testing excludes write data to and reading data back from the tested flash blocks, and then comparing the read back data to the data written to the tested flash blocks.

In step S217, at most only a "minority" or at most only a "small minority" of blocks of flash memory 270 of flash memory device 260 is subjected to 'heavyweight' bad block testing (for example, at most 20% or at most 10% or at most 5% or at most 1%—i.e. some small sample). Effecting the 'heavy' bad block testing to only a minority of blocks of flash 270 may be useful so that, at a later stage when the user 'powers up' the flash memory device and uses the device for the first time, the user is able to write data to at least some 'readily-available' pre-tested flash blocks without experiencing, at least initially, any performance delay caused by the need to bad block test when writing data to flash.

In step S123, the flash device 260 is coupled to the host device 310. In one example, this coupling is carried out in some sort of manufacturing facility (not necessarily the same facility where steps S105 and/or S215 were carried out)—for example, a facility where flash devices are deployed within a chassis or housing of a laptop or cellular telephone. In another example, step S123 is carried out 'in the field'—for example, after individual flash devices are shrink-wrapped and shipped. In this second example, the shrink wrap packing is opened by the end user, and the end user couples the flash device to the host device 310.

In step S127, flash device 260 receives user data from host device 310

Any type of user data may be received into flash device 260, including but not limited to .pdf files, audio or video digital media files (for example, MP3 files or MP4 files or in any other format used for media files), Microsoft® Office files (for example, .doc files or .docx files, .ppt or .pptx files, etc), markup language files (for example, HTML or XML files), image files in .gif or .jpeg or any other format, compiled code files, or any other files.

In some embodiments where user data is received into flash device 260 in step S127, this user data is first stored in volatile memory (for example, RAM) within flash memory device 260, before eventually being written (i.e. see step S223 of FIG. 4).

Because the flash device 260 is shipped and provided to a user with few or no flash blocks previously bad-block tested (for example, a significant majority—i.e. at least 80%, or at least 90% or at least 99% or at least 99.5% of the blocks have not been subjected to 'heavyweight' bad block testing and no final decision is made about whether or not any of the blocks of the 'significant majority' are good blocks or bad blocks), it is recognized that most or all bad block testing will take place after flash device 260 receives user data for the first time (or, in some embodiments, at a later time).

Therefore, in step S219, it is necessary to effect bad block testing to one or more flash block at a time after the user data has been received in order to store data to block which have been bad-blocked tested. As noted earlier, in some embodiments, the bad block testing is carried out for a particular target block to which the user data is to be stored. Alternatively or additionally, bad block testing may be carried out 'in the background.'

In one non-limiting example (for example, relating to the use case where the bad block testing is carried out in response to the directive to write the user data received in step S127), the bad-block testing of step S219 includes determining one or more target blocks to which the user data is to be written— in one particular non-limiting example, the determining may be carried out according to physical or logical addressing information received from the host in step S127). In some embodiments, the determining is carried out in response to the data receiving of data in step S127.

In step S223, received user data is stored in one or more flash blocks that have been tested in step S219.

In some embodiments, after the user data is stored in the one or more flash blocks, one or more 'housekeeping' operations are carried out to update one or more 'system data structures (for example, a flash management table or a file system table or an events log) in accordance with the storing of the user data in step S223. For example, the flash management table(s) may be updated to indicate that the location(s) of the 'target block' (e.g. described by the addressing information) is now occupied by data. In another example, a file system table or another 'translation table' for an object-oriented data storage system is updated to indicate that one or more file(s) or data object(s) are now stored, at least in part, at locations specified by the identification information for the one or more target block(s). In yet another example, an events log indicating that the storage operation of step S223 has taken place is updated.

A Discussion of FIG. 5

FIG. 5 is a flow chart of a routine for testing and using a flash memory device in accordance with some embodiments.

FIG. 5 relates to the specific case where the use operation of step S217 includes the receiving of user data by flash device 260 from host device 310.

Figure 5A:
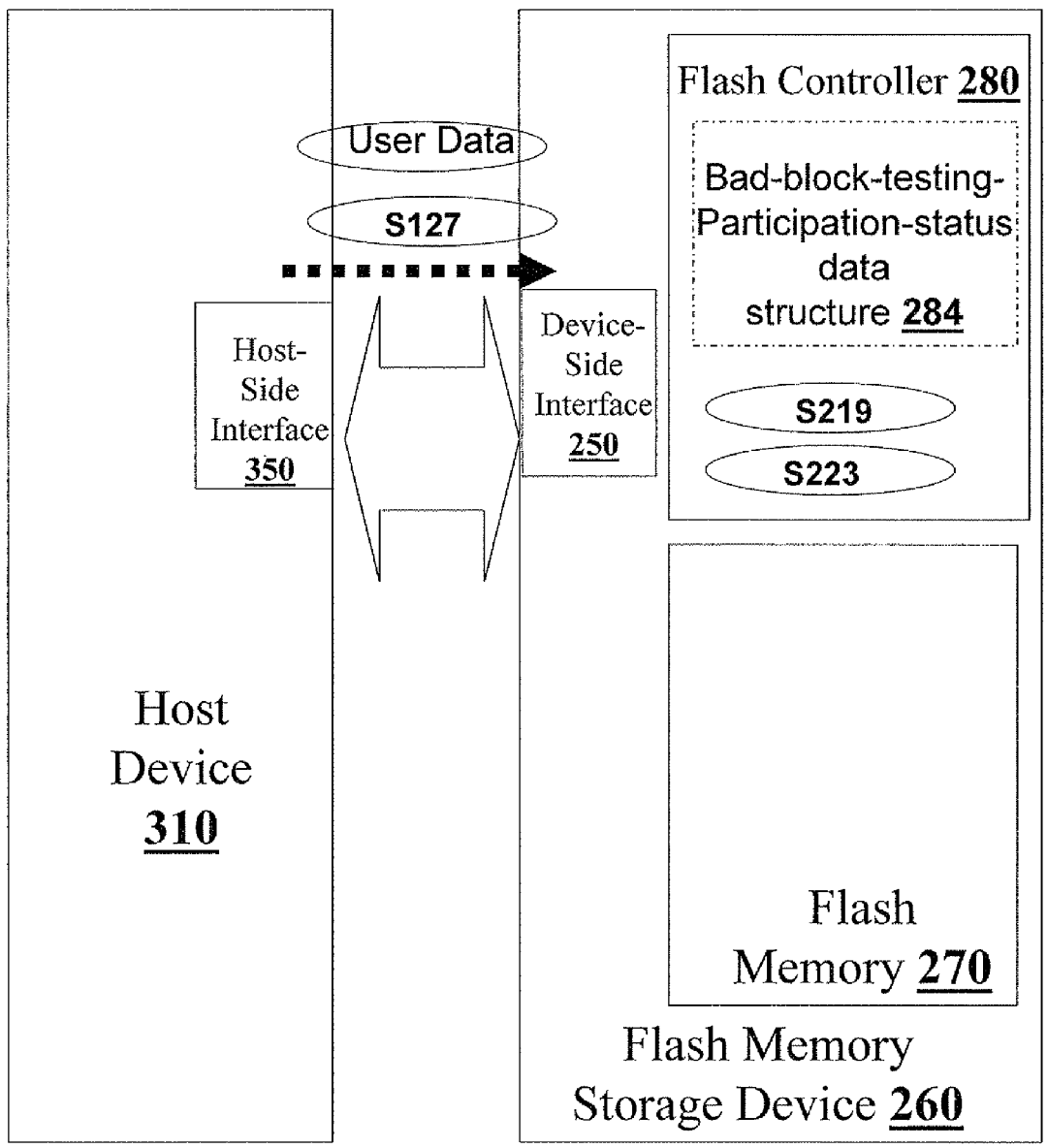
FIGS. 5A, 5B are block diagrams of a system including a flash memory storage device and a host device in accordance with some embodiments.
Figure 5B:
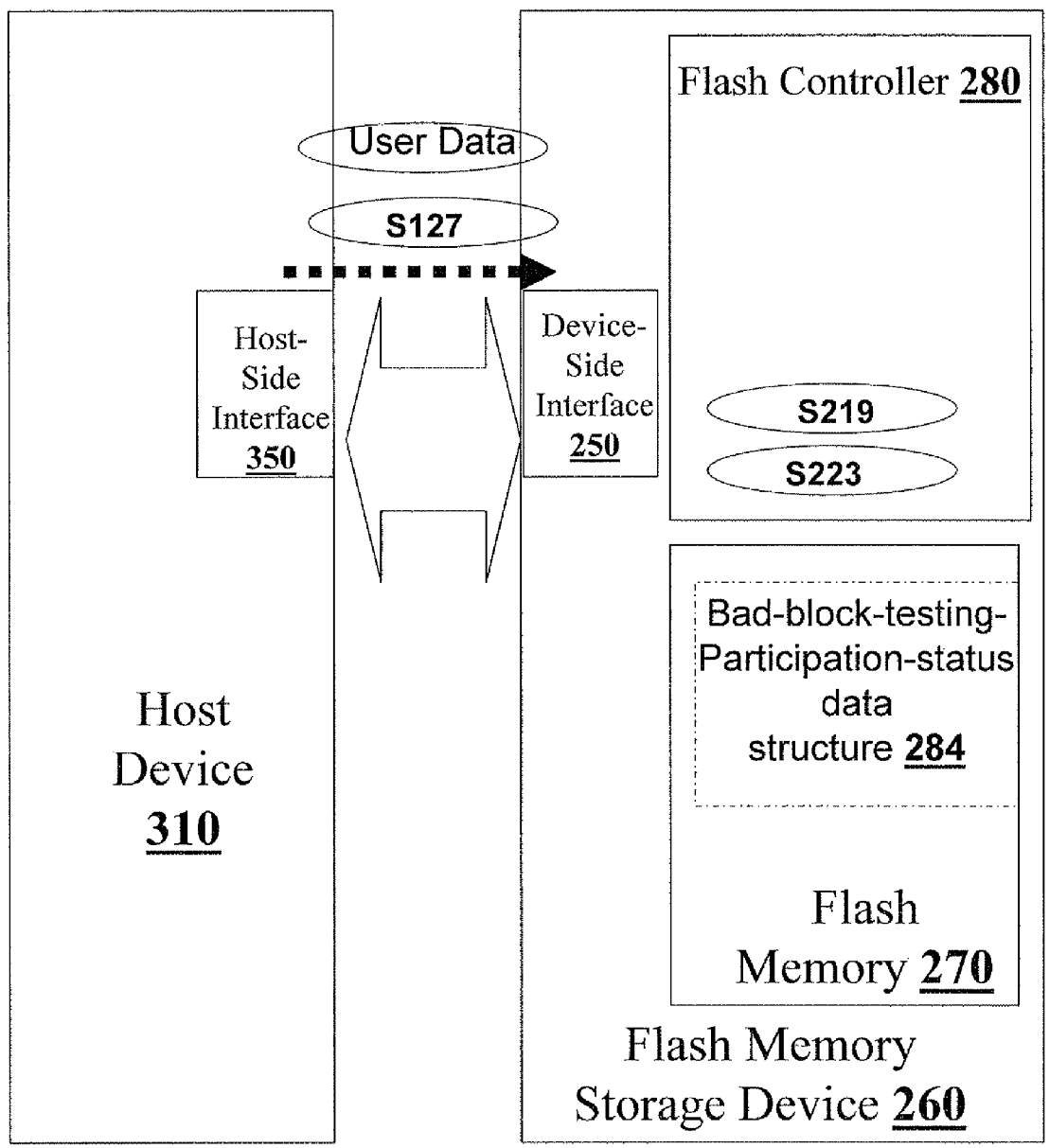

A Discussion of FIGS. 5A-5B

FIGS. 5A-5B illustrate an exemplary system in which the technique of FIG. 4, may be carried out. It is noted that flash controller 280 may be implemented using any combination of hardware (for example, including a microprocessor and optionally volatile memory such as RAM or registers), firmware and/or software (for example, computer code which is stored in volatile and/or non-volatile memory and is executable by a microprocessor). Controller 280 may include any software and/or firmware and/or hardware element(s) including but not limited to field programmable logic array (FPLA) element(s), hard-wired logic element(s), field programmable gate array (FPGA) element(s), and application-specific integrated circuit (ASIC) element(s). Any instruction set architecture may be used in controller 280 including but not limited to reduced instruction set computer (RISC) architecture and/or complex instruction set computer (CISC) architecture.

Example device-side interfaces 250 include but are not limited to MMC interfaces, USB interface, SD interfaces, and ISO 7816 family interfaces.

In the non-limiting example of FIGS. 5A-5B, steps S219 and S223 are carried out by flash controller 280.

As noted earlier, host device may be a laptop, a desktop, a cell phone, a PDA, a digital camera or any other host device. In some embodiments, the bad block testing of step S219 is carried out (i) at a time when flash device 260 is coupled to host device 310; and/or (ii) at a time when flash device 260 is located within a housing of host device 310 (for example, within a laptop chassis or within a cell phone housing).

As shown in FIGS. 5A-5B, flash device 260 may also include a 'bad-block-testing participation-status data structure' 284. Although both FIGS. 5A and 5B illustrate this data structure as stored within flash memory storage device 260, this is not to be construed as a limitation, and at least of portion of 'bad-block-testing participation-status data structure' 284, may reside outside of flash device 260 (for example, on host device 310).

In the non-limiting example of FIG. 5A, bad-block-testing participation-status data structure' 284 resides within flash controller 280. In the non-limiting example of FIG. 5B, bad-block-testing participation-status data structure' 284 resides within flash memory 270.

Figure 6B:

FIG. 6A-6B illustrate non-limiting examples of a bad-block-testing participation-status data structure' 284. In the example of FIG. 6A, bad-block-testing participation-status data structure' 284 is a 'participation table 286'—if a block has already been subjected to bad-block testing, then the participation status code is 1, and if the block has not yet been subjected to bad-block testing, then the participation status code is 0. In the example of FIG. 6A, blocks 235, 237, 238 and 239 have already been bad-block tested, while block 236 has not yet been bad-blocked tested. Thus, the participation table describes whether or not a particular block has 'participated in'/'been subjected to' bad-block testing.

Participation table 286 may be used in conjunction with a 'testing results table.' In contrast to participation table 286 which illustrates whether or not a bad block has been tested irrespective of the testing results, testing results table 288 illustrates the results of the bad-block testing. In the non-limiting example of FIG. 6A, blocks 235 and 239 are known good blocks, while block 238 is a known bad-block.

In FIG. 6B, bad-block-testing participation-status data structure 284 is a hybrid table or array—if a block is a known bad-block, a '1' is stored; if a block is a known good-block, a '2' is stored, if it is known that a block has never been subjected to bad-block testing, then a '0' is stored. The table of FIG. 6B is a 'hybrid' table because it contains two types of information: (i) whether or not a block has been subjected to bad-block testing; and (ii) the results of the bad-block test.

In one non-limiting example related to FIG. 6A, the tables of FIG. 6A may be used as follows: initially, the 'participation status code' for all blocks is set to '0' and the 'test results code' for each block is irrelevant/may have any value. When the device is shipped (e.g. either to an end user or to a different manufacturing facility or portion of a manufacturing facility), most or all blocks in participation table 286 are associated with a '0' status. When a particular block is tested, the 'participation status code' for that block in participation table 286 is changed from '0' to '1'; and the test results code is updated according to the results of the test (0 for a bad block; 1 for a good block). When a particular block is considered for storing user data, participation table 286 may be consulted—only if the participation status code for the particular block is '1' may data be written to the particular block. It is noted that this is a necessary condition but not a sufficient condition—in addition, in order to allow writing data to the particular block, the 'test results code' must also be '1' for the particular block.

In one non-limiting example related to FIG. 6B, the table of FIG. 6B may be used as follows: initially, all entries are set to '0'. When the device is shipped (e.g. either to an end user or to a different manufacturing facility or portion of a manufacturing facility), most or all blocks in participation table 286 are associated with a '0' status code. When a particular block is tested, the 'status code' for that block in participation table 286 is: (i) changed from '0' to '1' if the particular block is determined to be a bad-block; and (ii):) changed from '0' to '2' if the particular block is determined to be a good-block. When a particular block is considered for storing user data, the hybrid table may be consulted—only if the participation status code for the particular block is '2' may data be written to the particular block.

Figure 7:
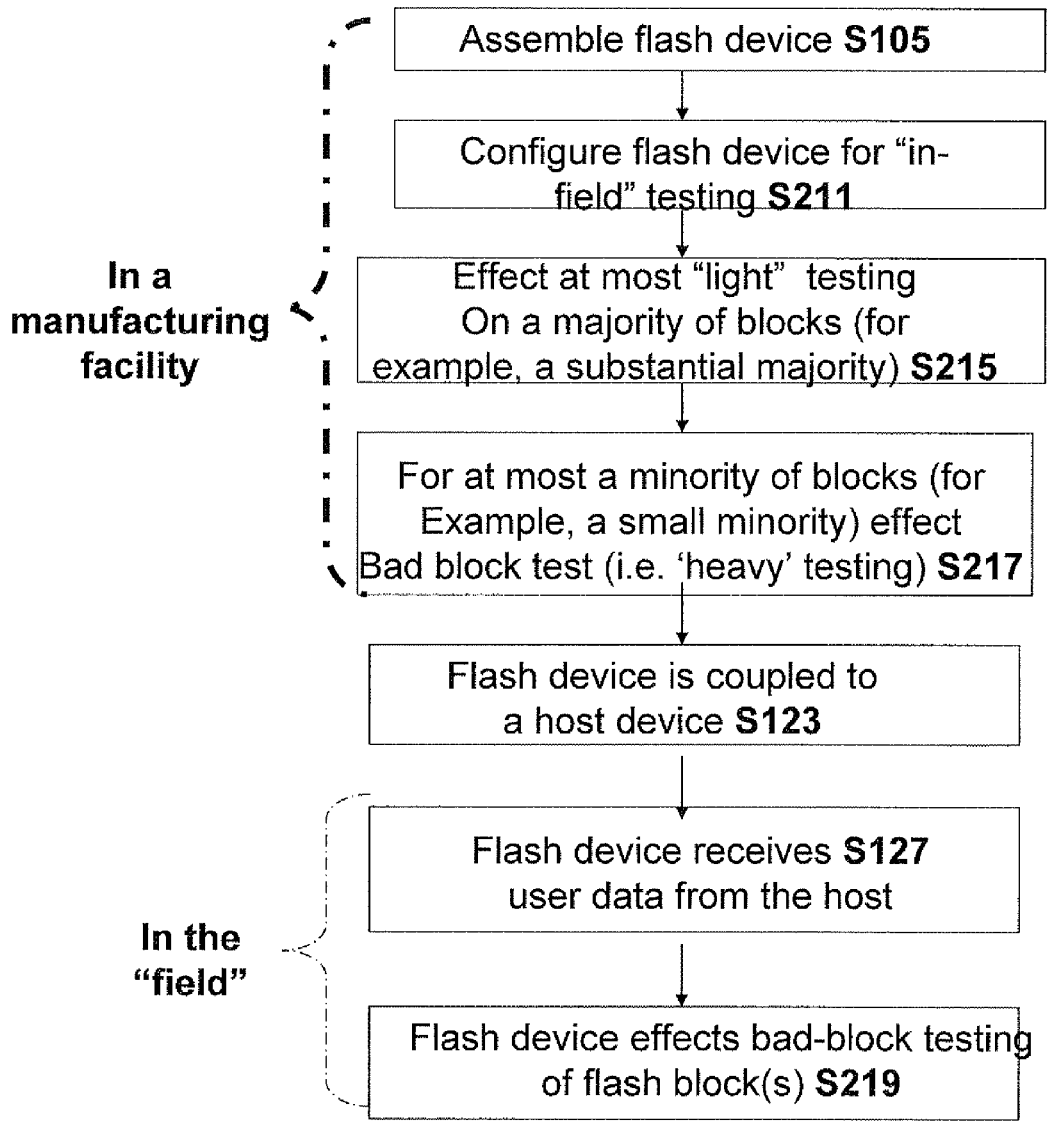

A Discussion of FIG. 7

Reference is made to FIG. 7. In FIG. 7, during manufacture, flash device 260 is configured for in-field testing in step S211. In one non-limiting example, firmware is loaded to flash controller 280 in step S211 (i.e. this is one example embedding code into the flash device), where the firmware is configured so that execution of the firmware by flash controller 280 is operative to effect at least one bad block test operation S219 after receiving user data S127.

Figure 8:
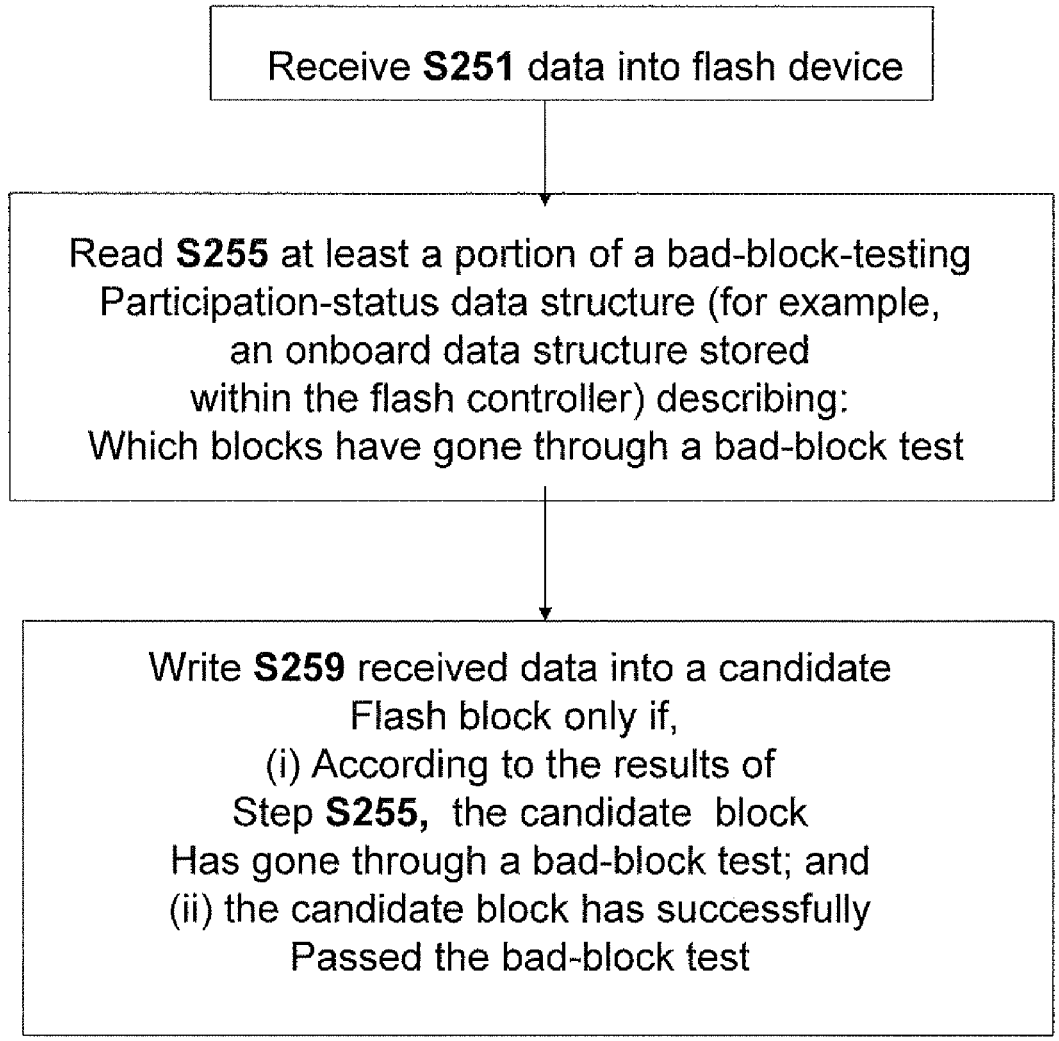
FIG. 8 is a flow chart of a routine for writing data into flash memory in accordance with contents of a bad-block-testing participation-status data structure.

A Brief Discussion of FIG. 8

FIG. 8 is a flow chart of a routine for writing data to flash memory 270 in accordance with some embodiments. In step S251, data is received into flash device 260. In step S255, at least a portion of bad-block participation-status data structure is read (for example, by a flash controller 280 and/or a processor within flash controller 280—i.e. either the original data structure or a cache copy) from volatile and/or non-volatile memory.

In step S259, the writing of data into a candidate flash block of flash memory 270 is contingent upon the results of the reading of step S255. Thus, in step S259, data written into the candidate flash block only if (i) the bad-block-status participation-status data structure 284 indicates that the candidate flash block has gone through a bad-block test, and (ii) there is an indication that the candidate flash block has successfully passed the bad-block test (for example, there is an indication in testing results table of FIG. 6A or in hybrid table of FIG. 6B or there is any other indication).

Figure 9:
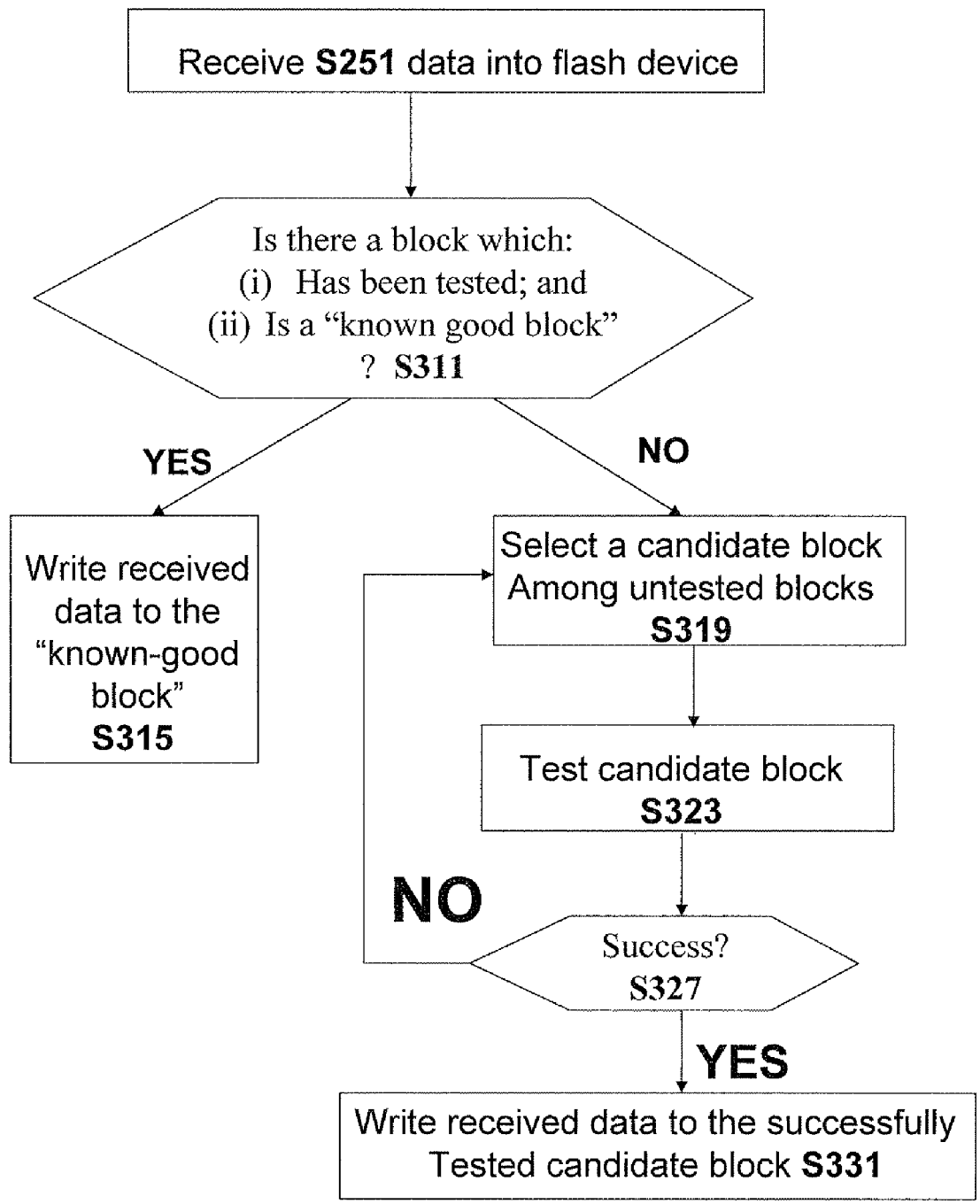
FIG. 9 is a flow chart of a routine for providing 'on-demand' bad-block testing in response to receiving data into a flash device.

FIG. 9 is a flow chart of a routine for providing 'on-demand' bad-block testing in response to receiving data into a flash device.

In step S251, data is received into flash device 260 from host device 310. In step S311, it is determined if there is a block which (i) has been tested (i.e. has been subjected to bad block testing where a final decision is made about whether the block is a good block or a bad block); and (ii) is not a 'known bad block'—i.e. is a 'known good block' according to the results of bad block testing. In some embodiments, step S311 is carried out in accordance with the contents of bad-block-testing-participation-status data structure 384. One exemplary implementation of step S311 is described below, with reference to FIG. 10.

In the event that there is a block of flash 270 within device 260 which (i) has been tested; and (ii) is a known good block (i.e. it successfully passed the bad block testing whereby a "final" decision was made that the block is a known good block), then the data received in step S251 is written, in step S315, to the "known good block."

Otherwise, block(s) are tested "on demand" until a block is found which passes the bad block testing (i.e. for which a final decision is made that the block is a good block).

Thus, a candidate block is selected, in step S319 and tested in step S323. In the event that the candidate block "passes" the bad block testing of step S323 and is "known" in a final decision to be a good block, then the received data is written, in step S331, to the candidate block.

Otherwise, a different candidate block is tested in step S319.

Figure 10:
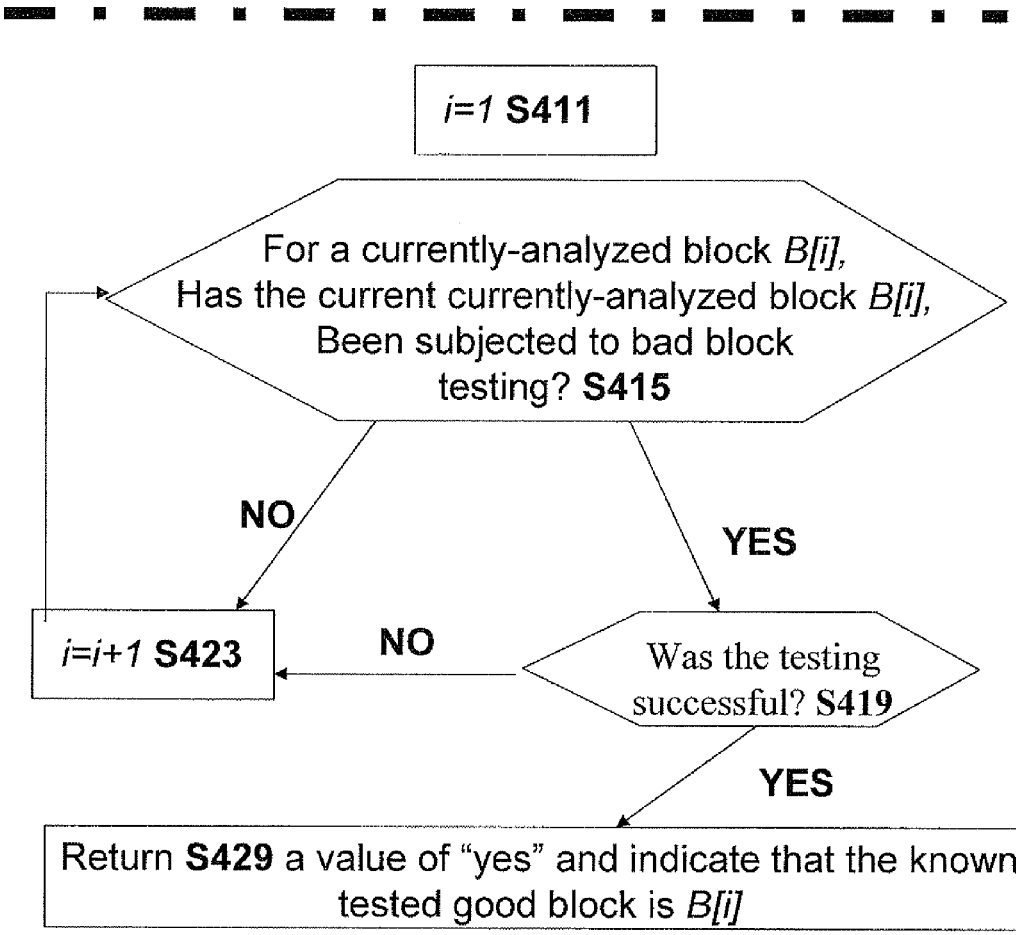
FIG. 10 is a flow chart of a routine for determining if a block is available that has been previously tested and is known to be a good block.

FIG. 10 is a flow chart of a routine for determining if a block is available that has been previously tested and is known to be a good block. In the example of FIG. 10, device 260 has N blocks B[1] . . . B[N] where N is a positive integer and i is a dummy index whose value is between 1 and N.

In step S411, i is set to 1.

In step S415, it is checked (for example according to the contents of bad-block-testing-participation-status data structure 384) if the currently-analyzed block B[i] has been subjected to bad block testing. If not, then i is incremented so that step S415 is repeated for another block.

If yes, then if the testing was successful (see step S419), then this block (in step S429) is indicated as a known tested good block. Otherwise, i is incremented so that step S415 is repeated for another block.

It is further noted that any of the embodiments described above may further include receiving, sending or storing instructions and/or data that implement the operations described above in conjunction with the figures upon a computer readable medium. Generally speaking, a computer readable medium may include storage media or memory media such as magnetic or flash or optical media, e.g. disk or CD-ROM, volatile or non-volatile media such as RAM, ROM, etc. as well as transmission media or signals such as electrical, electromagnetic or digital signals conveyed via a communication medium such as network and/or wireless links.

Having thus described the foregoing exemplary embodiments it will be apparent to those skilled in the art that various equivalents, alterations, modifications, and improvements thereof are possible without departing from the scope and spirit of the claims as hereafter recited. In particular, different embodiments may include combinations of features other than those described herein. Accordingly, the claims are not limited to the foregoing discussion.

What is claimed is:

1. A method of operating a flash device having a flash memory, the method comprising:
   a) receiving user data for writing to the flash device from a host device coupled to the flash device; and
   b) after the receiving, effecting a bad-block testing operation for at least one flash block of the flash memory device, wherein the effecting further includes,
      a. determining one or more target blocks to which user data is to be written:
      b. subjecting the one or more target flash blocks to bad-block testing; and
      c. writing the user data to the target blocks upon completion of bad-block testing of the target blocks, wherein writing to the target blocks is effected contingent upon passing the bad-block testing for the target blocks.

2. The method of claim 1 wherein the bad-block testing operation is carried out in response to the user data receiving.

3. The method of claim 1 further comprising:
   c) in response to the bad-block testing of the one or more target flash blocks, updating a bad-block-testing participation-status data structure that describes which blocks of the flash memory have gone through a bad block test, the updating being carried out to indicate that the one or more target flash blocks have gone through bad-block testing.

4. The method of claim 3 wherein the updating is carried out in a manner that is not contingent upon the results of the bad-block testing of the one or more target blocks.

5. The method of claim 3 wherein the updating is further carried out to indicate, within the bad-block-testing participation-status data structure, the results of the bad-block testing of the one or more target flash blocks.

6. The method of claim 3 wherein the bad-block-testing participation-status data structure resides in the flash memory device.

7. The method of claim 6 wherein the bad-block-testing participation-status data structure resides in a controller of the flash memory device.

8. The method of claim 1 wherein the bad-block testing is carried out in a background process.

9. A flash device comprising:
   a) a device interface for coupling with a host device;
   b) a flash memory including a plurality of flash blocks; and
   c) a flash controller operative to:
      i) receive user data for writing to the flash device from the host device;
      ii) after the receiving, effect a bad-block testing operation for at least one of the flash blocks, wherein the bad-block testing operation is configured to,
      a. determine one or more target blocks to which user data is to be written;
      b. subject the one or more target blocks to bad-block testing; and
      c. write the user data to the target blocks upon completion of the bad-block testing of the target blocks, wherein the write to the target blocks is contingent upon a positive result from the bad-block testing of the target blocks.

10. A method of manufacturing a flash device, the method comprising:
    a) embedding code into the flash device which configures the flash device to process at least one bad block test operation after receiving user data, wherein the code for processing at least one bad block test operation includes code for,
       i. determining a target block within the flash device to which user data is to be written;
       ii. subjecting the target block to bad-block testing; and
       iii. writing the user data to the target block upon completion of bad-block testing of the target block, wherein writing to the target block is contingent upon passing the bad block testing of the target block.

11. The method of claim 10 further comprising:
    b) testing the flash device.

12. The method of claim 11 further comprising:
    c) packing and shipping the flash device, wherein:
       i) the testing is carried out before the packing and the shipping; and
       ii) the testing includes effecting only a lightweight testing to a majority of flash blocks of the flash device.

13. The method of claim 11 further comprising:
    c) packing and shipping the flash device, wherein:
       i) the testing is carried out before the packing and the shipping; and
       ii) the testing includes effecting a bad block testing to only a small minority of flash blocks of the flash device.

14. The method of claim 10 further comprising:
    b) before the code embedding, testing at least a portion of flash memory of the flash device.

15. The method of claim 14 wherein the testing includes effecting only a lightweight testing to a majority of flash blocks of the flash device.

16. The method of claim 14 wherein the testing includes effecting a bad block testing to only a small minority of flash blocks of the flash device.

17. A computer program product, comprising a computer readable medium having a computer readable program code embodied therein, said computer readable program code adapted to be executed to implement a method of operating a flash device, the method comprising:
    a) receiving user data for writing to the flash device from a host device coupled to the flash device; and
    b) after the receiving, effecting a bad-block testing operation for at least one flash block of the flash memory device, wherein the bad-block testing operation is configured to:
       i. determine one or more target blocks to which user data is to be written;
       ii. subject the one or more target blocks to bad-block testing; and
       iii. write the user data to the target blocks upon completion of the bad-block testing of the target blocks, wherein the writing to the target blocks is contingent upon a positive result from the bad block testing of the target blocks.

18. A method of writing data to a flash device having a flash memory, the method comprising:
    a) receiving data into the flash device from a host device coupled to the flash device;
    b) reading at least a portion of a bad-block-testing participation-status data structure describing which blocks of the flash memory have gone through a bad block test and test results from the bad block test; and
    c) only writing the received data to a particular flash block if, according to results of the reading, the particular flash block has gone through the bad block test and according to test results for the particular flash block a positive result is stored in the bad-block-testing participation-status data structure.

19. The method of claim 18 wherein the reading of step (b) is carried out in response to the data receiving of step (a).

20. The method of claim 18 wherein the bad-block-testing participation-status data structure resides in the flash memory device.

21. The method of claim 18 wherein the bad-block-testing participation-status data structure resides in a controller of the flash memory device.

22. A flash device comprising:
  b) a device interface for coupling with a host device;
  c) a flash memory including a plurality of flash blocks; and
  d) a flash controller operative to:
    i) receive data into the flash device from a host device coupled to the flash device;
    ii) read at least a portion of a bad-block-testing participation-status data structure describing which blocks of the flash memory have gone through a bad block test and test results from the bad block test; and
    iii) only writing the received data to a particular flash block if, according to results of the reading, the particular flash block has gone through the bad block test and according to test results for the particular flash block a positive result is stored in the bad-block-testing participation-status data structure.

23. A computer program product, comprising a computer readable medium having a computer readable program code embodied therein, said computer readable program code adapted to be executed to implement a method of writing data to a flash device having a flash memory, the method comprising:
  a) receiving data into the flash device from a host device coupled to the flash device;
  b) reading at least a portion of a bad-block-testing participation-status data structure describing which blocks of the flash memory have gone through a bad block test and test results from the bad block test; and
  c) only writing the received data to a particular flash block if, according to results of the reading, the particular flash block has gone through the bad block test and according to test results for the particular block a positive result is stored in the bad-block-testing participation-status data structure.

* * * * *